(12) United States Patent
Sim (10) Patent No.: US 9,751,475 B2
(45) Date of Patent: Sep. 5, 2017

(54) LINEAR SENSOR APPARATUS FOR VEHICLE

(71) Applicant: MANDO CORPORATION, Pyeongtaek-si, Gyeonggi-do (KR)

(72) Inventor: Gyung Hun Sim, Seongnam-si (KR)

(73) Assignee: MANDO CORPORATION, Pyeongtaek-si, Gyeonggi-do (KR)

( * ) Notice: Subject to any disclaimer, the term of this patent is extended or adjusted under 35 U.S.C. 154(b) by 0 days.

(21) Appl. No.: 14/736,022

(22) Filed: Jun. 10, 2015

(65) Prior Publication Data

US 2015/0362307 A1 Dec. 17, 2015

(30) Foreign Application Priority Data

Jun. 11, 2014 (KR) .......... 10-2014-0070602

(51) Int. Cl.
| | |
|---|---|
| G01B 7/02 | (2006.01) |
| B60R 16/023 | (2006.01) |
| G01R 33/00 | (2006.01) |
| G05G 1/00 | (2006.01) |
| G01D 5/14 | (2006.01) |
| G01D 11/30 | (2006.01) |

(52) U.S. Cl.
CPC .......... B60R 16/023 (2013.01); G01D 5/145 (2013.01); G01D 11/30 (2013.01); G01R 33/0047 (2013.01); G05G 1/00 (2013.01)

(58) Field of Classification Search
CPC ........ G01D 5/145; G01D 5/20; G01D 11/245; G01D 11/30; G01D 5/12; G01D 5/2046; G01D 5/142; G01D 5/165; G01D 5/2013; B60L 13/04; B60L 11/1803; F16H 59/105; F16H 59/0204; B60G 17/019; B60G 2204/11
USPC .............. 324/207.2, 207.25, 207.24, 207.13, 324/207.22, 207.15, 207.21, 207.17, 324/207.23, 207.26, 252, 262, 662; 318/376
See application file for complete search history.

(56) References Cited

U.S. PATENT DOCUMENTS

| | | | | |
|---|---|---|---|---|
| 5,351,776 A | * | 10/1994 | Keller | ..................... B60T 8/175 180/197 |
| 6,554,318 B2 | * | 4/2003 | Kohut | ................... B60R 21/013 180/268 |
| 6,729,194 B2 | * | 5/2004 | Kaijala | ................... B60R 22/18 73/811 |

(Continued)

FOREIGN PATENT DOCUMENTS

| | | | | |
|---|---|---|---|---|
| CN | 203037204 | * | 7/2013 | ............... G01B 7/02 |
| KR | 10-1995-0013889 A | | 6/1995 | |

*Primary Examiner* — Alesa Allgood
(74) *Attorney, Agent, or Firm* — McDermott Will & Emery LLP (57) ABSTRACT

A linear sensor apparatus for a vehicle includes a housing which includes an accommodation space therein, a mobile member which is provided in the accommodation space and has at least a part that extends from the housing outward to be connected to a predetermined driving system of the vehicle and linearly moves between a first area and a second area according to driving of the driving system, a magnet member provided in the mobile member, and an output unit which outputs an OFF value when the magnet member is located in the first area and outputs an ON value when the magnet member is located in the second area.

6 Claims, 6 Drawing Sheets

(56) References Cited

U.S. PATENT DOCUMENTS

| | | | | |
|---|---|---|---|---|
| 9,517,793 | B2* | 12/2016 | Sim | B62D 5/0469 |
| 2010/0289484 | A1* | 11/2010 | Quinn | G01D 5/145 |
| | | | | 324/207.2 |
| 2014/0353071 | A1* | 12/2014 | Ando | B60G 17/019 |
| | | | | 180/445 |
| 2015/0367882 | A1* | 12/2015 | Sim | B62D 5/0469 |
| | | | | 701/43 |

* cited by examiner

LINEAR SENSOR APPARATUS FOR VEHICLE

CROSS-REFERENCE TO RELATED APPLICATION

This application claims priority to and the benefit of Korean Patent Application No. 10-2014-0070602, filed on Jun. 11, 2014 the disclosure of which is incorporated herein by reference in its entirety.

BACKGROUND

1. Field of the Invention

The present invention relates to a linear sensor apparatus for a vehicle, and more particularly, to a linear sensor apparatus for a vehicle, capable of outputting an ON/OFF value due to a magnet member included in a mobile member which linearly moves between a first area and a second area according to driving of a driving system of the vehicle.

2. Discussion of Related Art

As a range of mounting electric components in a vehicle has been expanded, electronic equipment of systems which are mechanically driven has been rapidly performed. According thereto, an input unit which converts an input signal from a driver into electrical signals is urgently needed.

For example, in the case of a brake pedal or an electric steering component, a measuring unit which measures an amount of movement is very significant.

To measure an amount of movement of a system for a vehicle as described above, linear sensors have been previously used, each of which outputs an analog or pulse width modulation (PWM) signal depending on a distance between a magnet and a sensor to measure the amount of movement of the system.

Meanwhile, in the case of the brake pedal or electric steering component, to perfectly receive an input signal of a driver, mechanical offset compensation is necessary. Particularly, in the case of a steering system, it is very important to detect an absolute position with respect to a present steering angle of the wheels. When a certain amount of offset is not properly compensated at a point in time that an electric control unit (ECU) is turned ON, a certain amount of drag occurs in a brake system and remains as a loss and it is impossible to ensure the straight driving of a vehicle.

However, since general linear sensors use a method of converting a magnetic force value output from a magnet into an analog or digital value, an output value may vary depending on an input voltage or a peripheral environment.

Accordingly, it is necessary to overcome the limitations described above.

PRIOR ART DOCUMENT

Patent Document

Korean Patent Publication No. 1995-0013889

SUMMARY OF THE INVENTION

The present invention is directed to a linear sensor apparatus for a vehicle, the apparatus capable of precisely detecting a driving degree in a predetermined driving system of the vehicle.

The present invention is also directed to integrating a plurality of driving-detection-related apparatuses in a general driving system.

Aspects of the invention will not be limited to the described above, and additional aspects of the present invention will be obvious to one of ordinary skill in the art from the description as follows.

According to an aspect of the present invention, there is provided a linear sensor apparatus for a vehicle. The linear sensor apparatus includes a housing which includes an accommodation space therein, a mobile member which is provided in the accommodation space and has at least a part that extends from the housing outward to be connected to a predetermined driving system of the vehicle and linearly moves between a first area and a second area according to driving of the driving system, a magnet member provided in the mobile member, and an output unit which outputs an OFF value when the magnet member is located in the first area and outputs an ON value when the magnet member is located in the second area.

The mobile member may include an accommodation portion provided in the accommodation space, in which the magnet member is provided, and an extending portion which is connected to the accommodation portion and extends from the accommodation space outward to be connected to the predetermined driving system of the vehicle.

The accommodation portion may include an accommodation groove having a shape corresponding to the magnet member, into which the magnet member is mounted.

The housing may include a through hole formed to be long in a longitudinal direction, through which the extending portion passes.

A width of the accommodation portion may be greater than a width of the through hole, and a width of the extending portion may be smaller than the through hole.

The magnet member may include protruding portions which protrude from both sides of the mobile member, and the housing may include switch units which are in contact with the protruding portions and generate an electrical signal while the magnet member is located in the second area and transmit the electrical signal to the output unit.

The switch units may be formed to be long in a longitudinal direction of the second area.

The driving system may be a rear-wheel steering system.

The driving system may be a brake system.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

Exemplary embodiments of the present invention will be described in detail below with reference to the accompanying drawings. While the present invention is shown and described in connection with exemplary embodiments thereof, it will be apparent to those skilled in the art that various modifications can be made without departing from the spirit and scope of the invention.

Hereinafter, exemplary embodiments of the present invention, which may embody aspects of the present invention, will be described with reference to the attached drawings. Throughout the specification, like reference numerals designate like elements and a repetitive description thereof will be omitted.

Figure 1:
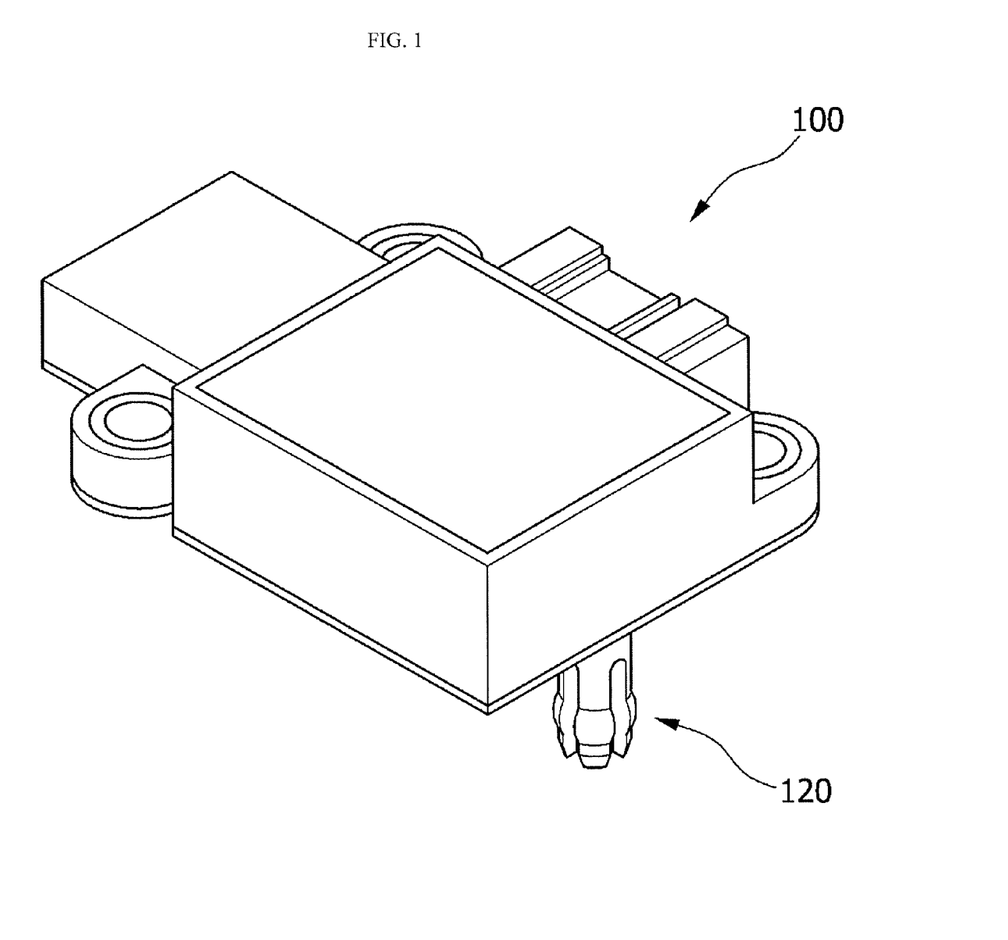
FIG. 1 is a perspective view illustrating the entire appearance of a linear sensor apparatus for a vehicle according to one embodiment of the present invention.
Figure 2:
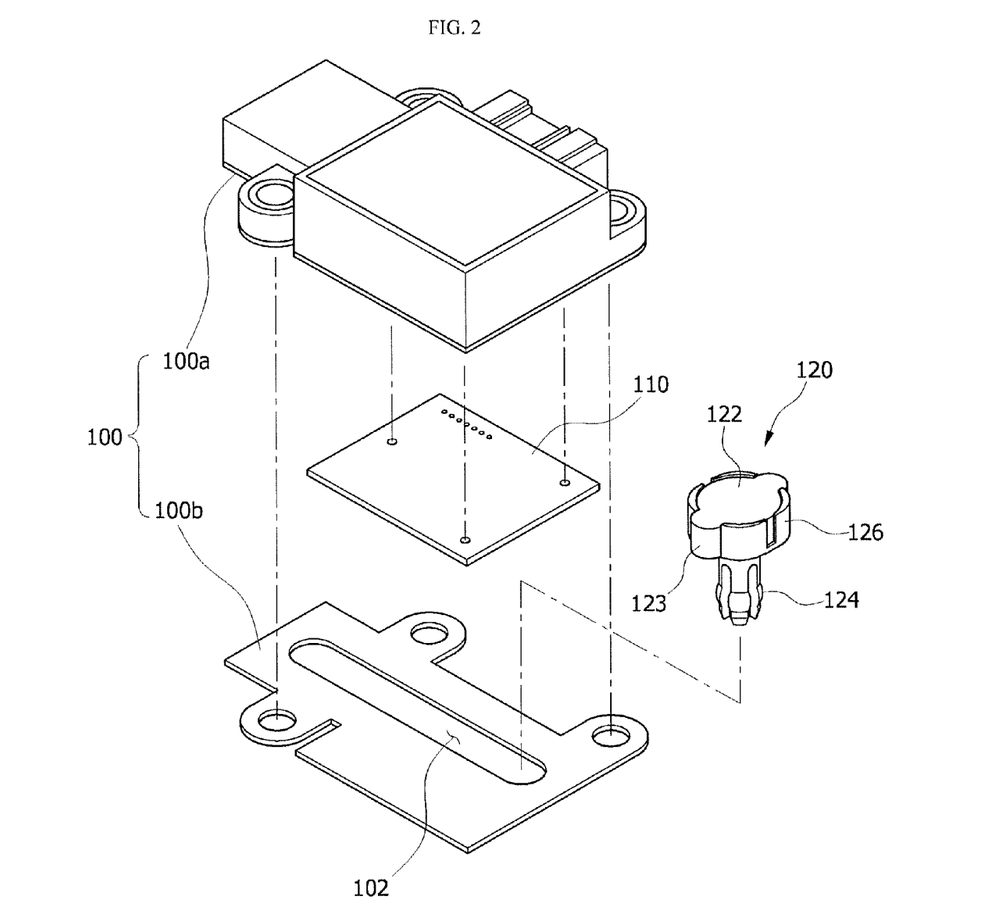
FIG. 2 is an exploded perspective view illustrating a structure of the linear sensor apparatus according to one embodiment of the present invention.

FIG. 1 is a perspective view illustrating the entire appearance of a linear sensor apparatus for a vehicle according to one embodiment of the present invention. FIG. 2 is an exploded perspective view illustrating a structure of the linear sensor apparatus according to one embodiment of the present invention.

As shown in FIGS. 1 and 2, the linear sensor apparatus according to one embodiment includes a housing 100, a mobile member 120, a magnet member 122, and an output unit 110.

The housing 100 includes an accommodation space thereinside, in which other components are accommodated. According to the embodiment of the present invention, the housing 100 includes an upper housing 100a and a lower housing 100b and the accommodation space is formed by combining the same.

Also, an extending portion 124 of the mobile member 120, which will be described below, passes through the lower housing 100b and a through hole 102 which is formed long in a longitudinal direction and formed in the lower housing 100b. That is, the mobile member 120 may move along the through hole 102.

The mobile member 120 is included in the accommodation space but at least a part thereof extends from the housing 100 and is connected to a predetermined driving system of the vehicle. Also, according to driving of the driving system, the mobile member 120 may linearly move between a first area and a second area.

In the embodiment of the present invention, the mobile member 120 includes an accommodation portion 126 and the extending portion 124. The accommodation portion 126 includes the magnet member 122 which will be described below and is included in the accommodation space. Also, the extending portion 124 is connected to the accommodation portion 126 and extends from the accommodation space and is connected to the predetermined driving system of the vehicle.

Here, the accommodation portion 126 includes an accommodation groove having a shape corresponding to the magnet member 122, into which the magnet member 122 is mounted.

Also, the predetermined driving system of the vehicle may be one of a rear-wheel steering system and a brake system. That is, the extending portion 124 may be connected to any one component of the rear-wheel steering system and the brake system while being exposed outside the accommodation space and may linearly move along the through hole 102 according to driving thereof.

Accordingly, the linear sensor apparatus according to one embodiment of the present invention may perform one of measuring a central point of a rear-wheel steering apparatus and determining whether there is an input to a brake pedal, which will be described below.

Meanwhile, in order to prevent the mobile member 120 from being separated from the housing 100, a width of the accommodation portion 126 is greater than a width of the through hole 102 and a width of the extending portion 124 is smaller than the width of the through hole 102.

The magnet member 122 is included in the mobile member 120 and generates a magnetic force. Accordingly, the magnet member 122 may be moved together with the mobile member 120.

In the embodiment of the present invention, the magnet member 122 includes protruding portions 123 which protrude more than the mobile member 120 and are in contact with switch units 130 and 132 (refer to FIG. 3) which will be described below, thereby generating an electrical signal.

Also, the output unit 110 is provided in the accommodation space and senses the electrical signal generated by contact between the magnet member 122 and the switch units 130 and 132. However, embodiments of the present invention are not limited thereto and the output unit 110 may be provided as a type that senses the magnetic force of the magnet member 122.

Figure 3:
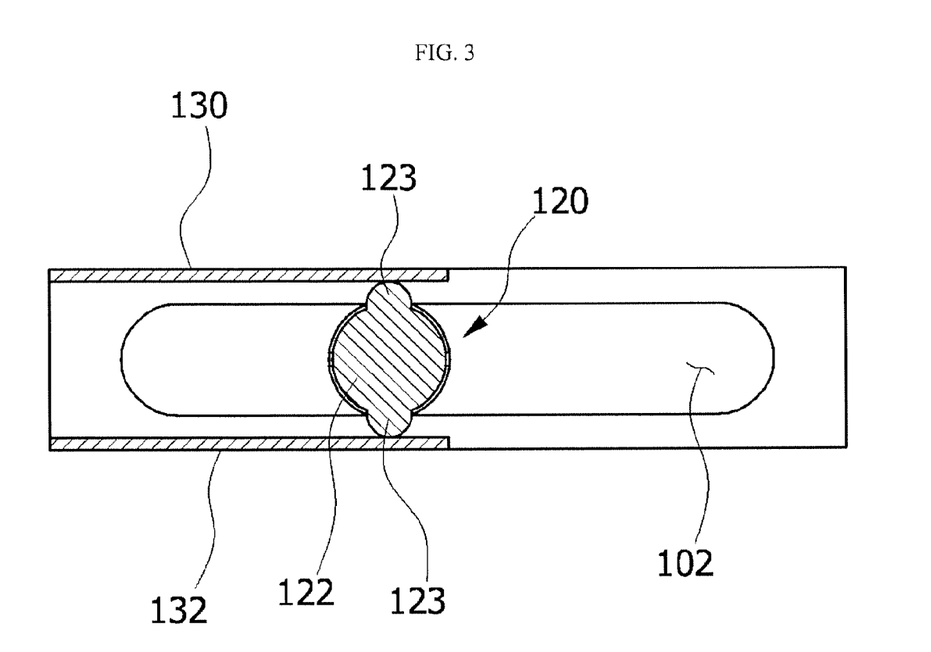
FIG. 3 is a cross-sectional view illustrating contact between a magnet member and a switch unit in the linear sensor apparatus according to one embodiment of the present invention.

FIG. 3 is a cross-sectional view illustrating the contact between the magnet member 122 and the switch units 130 and 132 in the linear sensor apparatus according to one embodiment of the present invention.

As shown in FIG. 3, the magnet member 122 includes the protruding portions 123 which protrude from both sides of the mobile member 120.

Also, the housing 100 includes the switch units 130 and 132 which are in contact with the protruding portions 123 and generate an electrical signal while the magnet member 122 is located in the second area and transmit the electrical signal to the output unit 110.

Here, in detail, in the embodiment of the present invention, the switch units 130 and 132 include a voltage generating port in contact with one of the protruding portions 123 and a monitoring port 130 in contact with the other of the protruding portions 123.

That is, in the case of the embodiment of the present invention, since an electrical signal is not generated when the magnet member 122 is located in the first area, the output unit 110 may generate an OFF signal. When the magnet member 122 is located in the second area, an electrical signal is generated due to the contact between the switch units 130 and 132 and the magnet member 122 and the switch units 130 and 132 may transmit the electrical signal to the output unit 110, thereby generating an ON signal.

Also, in the embodiment of the present invention, the switch units 130 and 132 are formed to be long in a longitudinal direction of the second area. Accordingly, even when the magnet member 122 is located in any position of the second area, it is possible to generate an electrical signal.

Figure 4:
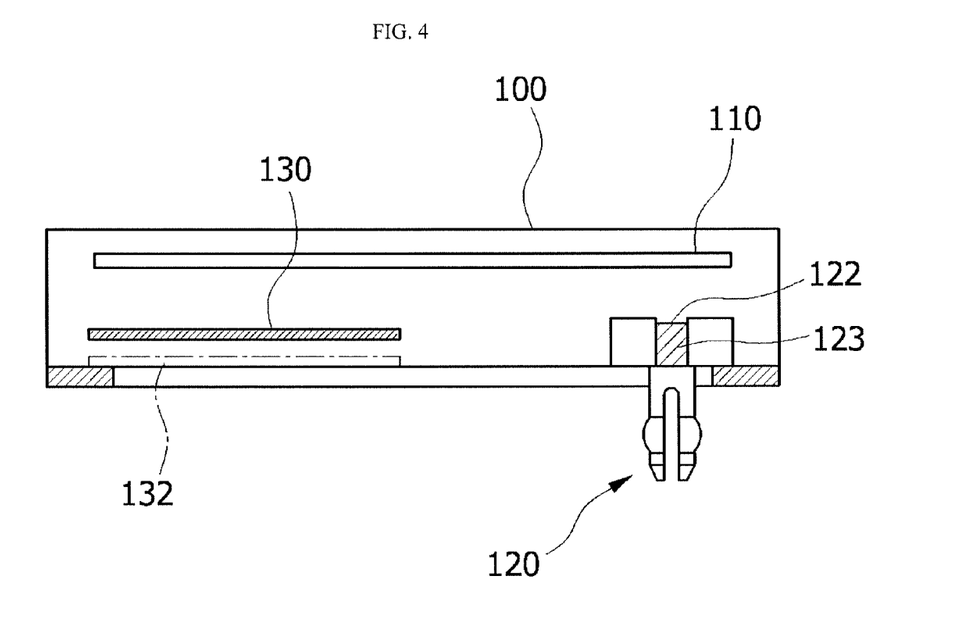
FIG. 4 is a cross-sectional view illustrating a state in which a mobile member and the magnet member are located in a first area in the linear sensor apparatus according to one embodiment of the present invention.
Figure 5:
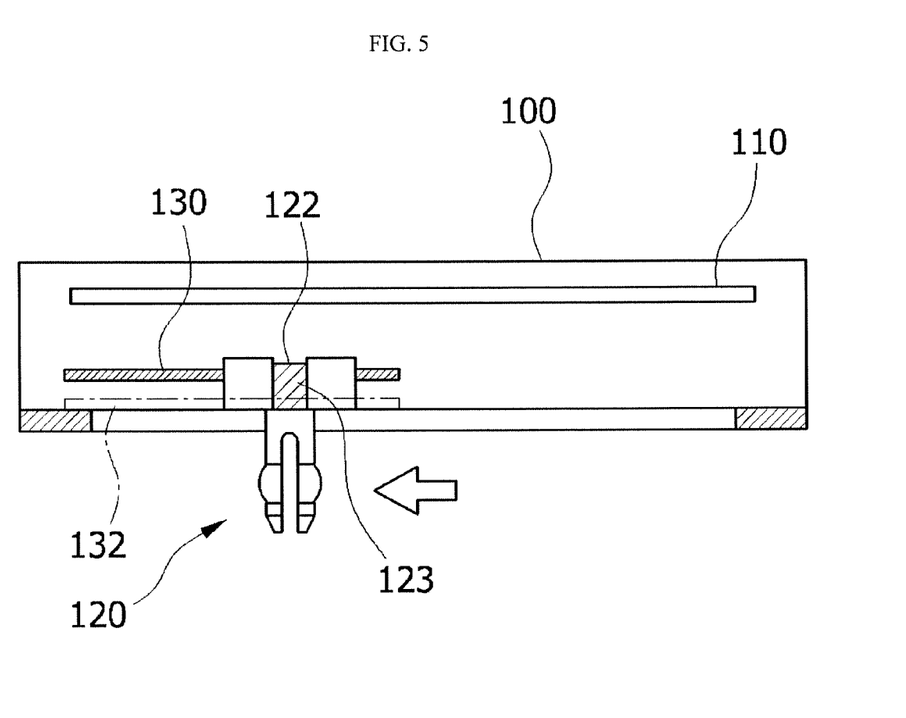
FIG. 5 is a cross-sectional view illustrating a state in which the mobile member and the magnet member enter a second area from the first area in the linear sensor apparatus according to one embodiment of the present invention.

FIG. 4 is a cross-sectional view illustrating a state in which the mobile member 120 and the magnet member 122 are located in the first area in the linear sensor apparatus according to one embodiment of the present invention. FIG. 5 is a cross-sectional view illustrating a state in which the mobile member 120 and the magnet member 122 enter the second area from the first area in the linear sensor apparatus according to one embodiment of the present invention.

As shown in FIGS. 4 and 5, in the embodiment of the present invention, a movement range of the mobile member 120 is divided into the first area and the second area based on a predetermined point. That is, as described above, the output unit 110 may output an OFF value when the magnet member 122 is located in the first area and may output an ON value when the magnet member 122 is located in the second area.

That is, in the case of the embodiment of the present invention, a point in time that the magnet member 122 shifts from the first area to the second area while moving from one side to other side is measured to be used for offset compensation.

Here, the point in time that the magnet member 122 shifts from the first area to the second area may be set as a point in time that the magnet member 122 is contact in the switch units 130 and 132 and an electrical signal is generated as described above.

Figure 6:
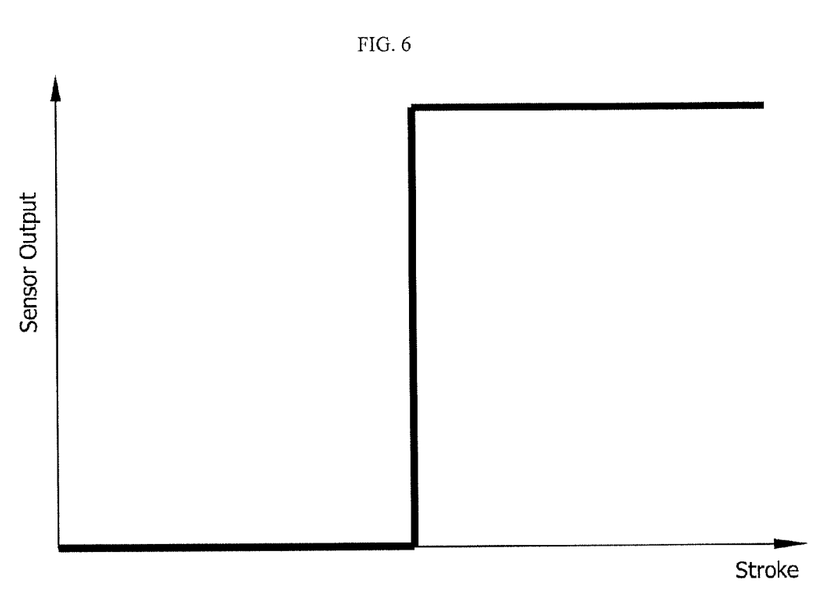
FIG. 6 is a graph illustrating a measuring algorithm of the linear sensor apparatus according to one embodiment of the present invention.

FIG. 6 is a graph illustrating a measuring algorithm of the linear sensor apparatus according to one embodiment of the present invention.

As shown in FIG. 6, since a sensor output measured by the output unit 110 has a digital change of ON/OFF in one embodiment of the present invention, a rising edge and a falling edge are present in the graph.

That is, as shown in FIG. 5, the point in time that the magnet member 122 enters the second area from the first area due to the mobile member 120 may be sensed by the output unit 110 and a present point may be calibrated to origin through an edge change at this point in time.

Here, the first area may indicate an ON signal and the second area may indicate an OFF signal or vice versa.

As described above, when the linear sensor apparatus according to one embodiment of the present invention is used, it is possible to measure a central point of a rear-wheel steering apparatus in a rear-wheel steering system or to precisely determine whether there is an input to a brake pedal in a brake system.

Also, a sensor value obtained by measuring an absolute position of the driving system by the linear sensor apparatus for the vehicle according to one embodiment of the present invention may be stored in an electronic control unit (ECU, not shown) for controlling a state of the vehicle. The sensor value may be stored in an electrically erasable and programmable read-only memory (EEPROM) which is an internal memory of the ECU. The stored sensor value may be used as information for allowing origin point control and position control when the driving system is driven.

As described above, the sensor value obtained by measuring the absolute position of the driving system by the linear sensor apparatus is used as the information for the origin control and position control, thereby easily performing the origin control and position control of the driving system.

The linear sensor apparatus according to the embodiments of the present invention has the following effects.

First, it is possible to precisely detect a driving degree of each apparatus in a driving system such as a brake system and rear-wheel steering system of a vehicle.

Second, according thereto, it is possible to integrate a plurality of driving-detection-related apparatuses in a general driving system, thereby reducing cost.

Third, since an apparatus is not complicated and simple, it is possible to reduce manufacturing costs and to significantly decrease a failure rate.

Effects of the invention will not be limited to the described above and additional effects will be obvious to one of ordinary skill in the art from the description as follows.

It will be apparent to those skilled in the art that various modifications can be made to the above-described exemplary embodiments of the present invention without departing from the spirit or scope of the invention. Thus, it is intended that the present invention covers all such modifications provided they come within the scope of the appended claims and their equivalents.

What is claimed is:

1. A linear sensor apparatus for a vehicle, comprising:
a housing which comprises an accommodation space therein and has an upper housing and a lower housing;
a mobile member which is provided in the accommodation space and extends from the housing outward, and linearly moves between a first area and a second area;
a magnet member provided in the mobile member; and
an output unit which outputs an OFF value when the magnet member is located in the first area and outputs an ON value when the magnet member is located in the second area,
wherein the lower housing includes a through hole formed in a longitudinal direction of the housing so that the mobile member moves along the through hole in the longitudinal direction, and
wherein the mobile member comprises:
an accommodation portion provided in the accommodation space, in which the magnet member is provided; and
an extending portion which is connected to the accommodation portion and extends from the accommodation space outward toward the through hole so that the extending portion passes through the through hole.

2. The linear sensor apparatus of claim 1, wherein the accommodation portion comprises an accommodation groove having a shape corresponding to the magnet member, into which the magnet member is mounted.

3. The linear sensor apparatus of claim 1, wherein a width of the accommodation portion is greater than a width of the through hole, and wherein a width of the extending portion is smaller than the through hole.

4. The linear sensor apparatus of claim 1, wherein the magnet member comprises protruding portions which protrude from both sides of the mobile member, and
wherein the housing comprises switch units which are in contact with the protruding portions and generate an electrical signal while the magnet member is located in the second area and transmit the electrical signal to the output unit.

5. The linear sensor apparatus of claim 4, wherein the switch units are formed to be long in a longitudinal direction of the second area.

6. A linear sensor apparatus for a vehicle, comprising:
a housing which comprises an accommodation space therein and has an upper housing and a lower housing;
a mobile member which is provided in the accommodation space and extends from the housing outward, and linearly moves;
a magnet member provided in the mobile member; and
an output unit which outputs a value corresponding to a position of the magnet member;

wherein the lower housing includes a through hole formed in a longitudinal direction of the housing so that the mobile member moves along the through hole in the longitudinal direction, and wherein the mobile member comprises:

an accommodation portion provided in the accommodation space, in which the magnet member is provided; and an extending portion which is connected to the accommodation portion and extends from the accommodation space outward toward the through hole so that the extending portion passes through the through hole.

\* \* \* \* \*